US011519978B2

(12) United States Patent
Hirota et al.

(10) Patent No.: US 11,519,978 B2
(45) Date of Patent: *Dec. 6, 2022

(54) MAGNETIC SENSOR AND CAMERA MODULE

(71) Applicant: TDK Corporation, Tokyo (JP)

(72) Inventors: Yohei Hirota, Tokyo (JP); Hayato Miyashita, Tokyo (JP); Tsuyoshi Umehara, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 43 days.

This patent is subject to a terminal disclaimer.

(21) Appl. No.: 17/212,430

(22) Filed: Mar. 25, 2021

(65) Prior Publication Data

US 2021/0208216 A1    Jul. 8, 2021

Related U.S. Application Data

(63) Continuation of application No. 15/992,411, filed on May 30, 2018, now Pat. No. 11,109,567.

(30) Foreign Application Priority Data

Jun. 8, 2017   (JP) .............................. JP2017-113576

(51) Int. Cl.
*G01R 33/09* (2006.01)
(52) U.S. Cl.
CPC ......... *G01R 33/093* (2013.01); *G01R 33/096* (2013.01); *G01R 33/098* (2013.01)

(58) Field of Classification Search
CPC ........................................... G01R 33/093–098
See application file for complete search history.

(56) References Cited

U.S. PATENT DOCUMENTS

| 3,971,958 A | 7/1976 | Rogora et al. |
| 10,302,456 B1 | 5/2019 | Choi et al. |
| 2002/0167307 A1 | 11/2002 | Chaparala |

(Continued)

FOREIGN PATENT DOCUMENTS

| CN | 105783684 A | 7/2016 |
| JP | 2012-122792 A | 6/2012 |

(Continued)

*Primary Examiner* — Patrick Assouad
*Assistant Examiner* — Demetrius R Pretlow
(74) *Attorney, Agent, or Firm* — Posz Law Group, PLC (57) ABSTRACT

A pair of bias magnets applies a bias magnetic field to the magneto-resistive effect element, the bias magnetic field having a component in a direction such that the component cancels the external magnetic field that is applied to the magneto-resistive effect element and a component that is perpendicular to the external magnetic field. The bias magnet has an elongate cross section in a plane that is parallel both to the external magnetic field and to the bias magnetic field. In a projection plane that is parallel to the cross section and onto which the bias magnets and the magneto-resistive effect element are projected, the bias magnet includes an element facing side that is opposite to the magneto-resistive effect element and that extends in a longitudinal direction. The bias magnet is magnetized in a direction that is perpendicular to the longitudinal direction. The element facing side is longer than other sides.

11 Claims, 10 Drawing Sheets

(56) References Cited

U.S. PATENT DOCUMENTS

| | | |
|---|---|---|
| 2004/0160220 A1 | 8/2004 | Wendt |
| 2008/0116885 A1 | 5/2008 | Van Zon et al. |
| 2009/0051353 A1 | 2/2009 | Takeya et al. |
| 2010/0117641 A1 | 5/2010 | Zhou |
| 2013/0119980 A1* | 5/2013 | Ogomi .................. G01R 33/096 324/252 |
| 2013/0218517 A1 | 8/2013 | Ausserlechner |
| 2013/0304422 A1 | 11/2013 | Ausserlechner et al. |
| 2014/0035570 A1 | 2/2014 | Jin et al. |
| 2014/0292321 A1* | 10/2014 | Yamazaki ............ G01R 33/098 324/252 |
| 2014/0292322 A1* | 10/2014 | Yamazaki ............ G01R 33/093 324/252 |
| 2015/0145504 A1* | 5/2015 | Bai ....................... G01R 33/093 324/207.13 |
| 2016/0041209 A1 | 2/2016 | Tsujimoto |
| 2016/0169984 A1 | 6/2016 | Werth et al. |
| 2016/0204161 A1* | 7/2016 | Suto ....................... H01L 27/222 257/427 |
| 2016/0313410 A1* | 10/2016 | Oba ...................... G01R 33/093 |
| 2017/0052038 A1 | 2/2017 | Aichriedler et al. |
| 2017/0356760 A1 | 12/2017 | David et al. |
| 2018/0011140 A1 | 1/2018 | Chawawre et al. |
| 2018/0017412 A1* | 1/2018 | Eagen ................... G01D 5/145 |
| 2018/0058905 A1 | 5/2018 | Zhang |
| 2018/0364066 A1 | 12/2018 | Satz et al. |
| 2020/0064416 A1 | 2/2020 | Fujiura et al. |

FOREIGN PATENT DOCUMENTS

| | | |
|---|---|---|
| JP | 2014-512003 A | 5/2014 |
| JP | 2014-209089 A | 11/2014 |
| JP | 5843079 B | 11/2014 |
| JP | 2016-080970 A | 5/2016 |
| JP | 2016-130686 A | 7/2016 |
| WO | 2011/074488 A1 | 6/2011 |
| WO | 2014/111976 A1 | 7/2014 |

* cited by examiner

MAGNETIC SENSOR AND CAMERA MODULE

CROSS REFERENCE TO RELATED APPLICATIONS

The present application is a continuation application of U.S. Utility application Ser. No. 15/992,411 filed on May 30, 2018, which is based on, and claims priority from, JP Application No. 2017-113576, filed on Jun. 8, 2017, the contents of which are incorporated herein by reference.

BACKGROUND OF THE INVENTION

The present invention relates to a magnetic sensor and a camera module using the same, and particularly to the configuration of a bias magnet.

DESCRIPTION OF THE RELATED ART

A magnetic sensor that includes a magneto-resistive effect element has recently been used as a sensor for detecting the position of a moving object. The magnetic sensor moves relative to a magnet and thereby detects the change of an external magnetic field that is generated by the magnet. For example, in a camera module, a lens, which is a moving object, moves relative to a magnet, and a magnetic sensor that is fixed to the lens moves relative to the magnet. This movement changes the positional relationship between the magnetic sensor and the magnet and changes the external magnetic field that is detected by the magnetic sensor. The amount of movement of the moving object is calculated based on the change of the output of the magnetic sensor.

Normally, an external magnetic field does not become zero, and an external magnetic field that is detected by a magnetic sensor changes around a certain magnetic field intensity other than zero due to the movement of the magnetic sensor relative to the magnet. WO2014/111976A1, JP5843079B and JP2016-130686A disclose a magnetic sensor having bias magnets that are arranged on both sides of a magneto-resistive effect element. The surface of the bias magnet that is opposite to the magneto-resistive effect element is inclined relative to a direction that is perpendicular to the magnetic field detecting direction of the magneto-resistive effect element. Thus, the bias magnet applies a bias magnetic field having a component in a direction such that the component cancels the external magnetic field that is applied to the magneto-resistive effect element. This enables a magnetic field that is applied to the magnetic sensor to substantially change around the zero magnetic field, thereby enhancing the linearity of the output and the accuracy with which the magnetic field intensity is detected.

SUMMARY OF THE INVENTION

The magnetic sensor disclosed in WO2014/111976A1 has a bias magnet that is common to a plurality of magneto-resistive effect elements. Therefore, the bias magnetic field changes for each magneto-resistive effect element, thus making it difficult to enhance the accuracy with which the magnetic field intensity is detected. The magnetic sensors disclosed in JP5843079B and JP2016-130686A have bias magnets for individual magneto-resistive effect elements, and the aforementioned problem hardly occurs. However, each bias magnet has an elongate cross section in which the surface that is opposite to the magneto-resistive effect element extends in the longitudinal direction, and the bias magnet is magnetized in a direction that is perpendicular to the longitudinal direction. Thus, the magnetization direction of the bias magnet is easily directed (bent) in the longitudinal direction due to the shape anisotropy of the bias magnet, and the bias magnetic field cannot effectively be applied in a direction that is perpendicular to the longitudinal direction. JP5843079B and JP2016-130686A also disclose a bias magnet having an approximately square cross section. Such a bias magnet is unlikely to cause the aforementioned a problem, but it is difficult to improve space efficiency.

An object of the present invention is to provide a magnetic sensor having a bias magnet which has a surface that is opposite to a magneto-resistive effect element and that extends in the longitudinal direction, which is magnetized in a direction that is perpendicular to the longitudinal direction and whose magnetizing direction is less likely to be directed in the longitudinal direction.

A magnetic sensor according to an embodiment moves relative to an external magnet and detects a change of an external magnetic field that is generated by the external magnet. The magnetic sensor comprises: a magneto-resistive effect element that generates a magnetic resistance change in accordance with the change of the external magnetic field; and a pair of bias magnets that is provided near the magneto-resistive effect element and that applies a bias magnetic field to the magneto-resistive effect element, the bias magnetic field having a component in a direction such that the component cancels the external magnetic field that is applied to the magneto-resistive effect element and a component that is perpendicular to the external magnetic field. The bias magnet has an elongate cross section in a plane that is parallel both to the external magnetic field and to the bias magnetic field. In a projection plane that is parallel to the cross section and onto which the bias magnets and the magneto-resistive effect element are projected, the bias magnet includes an element facing side that is opposite to the magneto-resistive effect element and that extends in a longitudinal direction, wherein the bias magnet is magnetized in a direction that is perpendicular to the longitudinal direction, and the element facing side is longer than the other sides.

The cross section of the bias magnet of the magnetic sensor of the present invention has an element facing side that is longer than the other sides, and the cross section does not have a simple rectangular shape. Therefore, the shape anisotropy effect is limited, and the magnetizing direction is less likely to be directed in the longitudinal direction. Therefore, according to the present invention, it is possible to provide a magnetic sensor having a bias magnet which has a surface that is opposite to a magneto-resistive effect element and that extends in the longitudinal direction, which is magnetized in a direction that is perpendicular to the longitudinal direction and whose magnetizing direction is less likely to be directed in the longitudinal direction.

The above and other objects, features and advantages of the present invention will become apparent from the following description with reference to the accompanying drawings which illustrate examples of the present invention.

DETAILED DESCRIPTION OF EMBODIMENTS

Hereafter, magnetic sensors according to various embodiments of the present invention will be described with reference to the drawings. While each embodiment mentioned below is directed to a magnetic sensor that is mounted on a camera module, the present invention is not limited to this and may be widely applied to a magnetic sensor that moves relative to an external magnet and detects a change of the external magnetic field that is generated by the external magnet. In the following description and the drawings, the x-direction is a direction in which an external magnetic field is applied (magnetic field detecting direction of the magnetic sensor), the y-direction is a direction that is perpendicular to the x-direction in a plane that is parallel both to the external magnetic field direction and to the bias magnetic field direction, and the z-direction is a direction that is perpendicular both to the x-direction and to the y-direction. The xy-plane is a plane on which magneto-resistive effect elements and bias magnets are arranged in an element array and corresponds to the in-plane direction of the free layer of the magneto-resistive effect element. The z-direction is parallel to the stacking direction of the magneto-resistive effect element.

Figure 1:
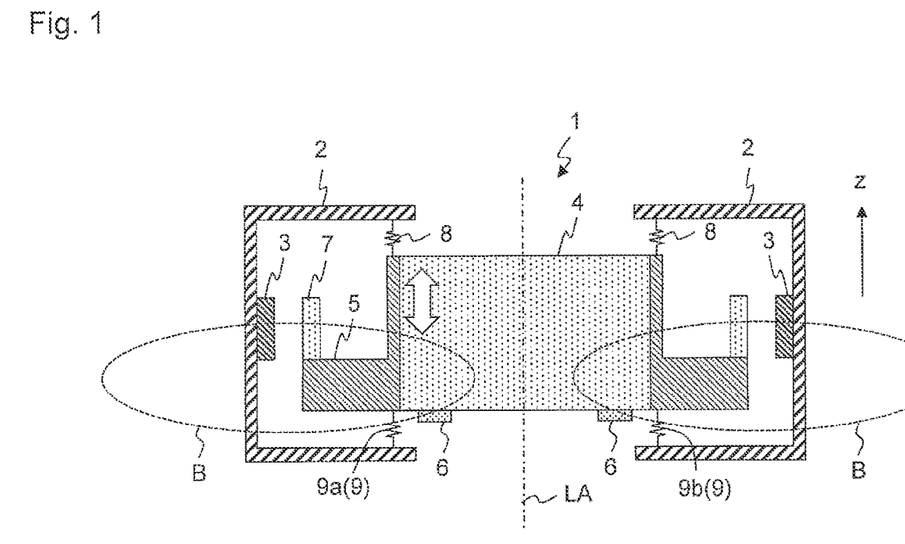
FIG. 1 is a conceptual diagram of a camera module to which a magnetic sensor of the present invention is applied.

FIG. 1 shows a conceptual diagram of camera module 1 to which the magnetic sensor of the present invention is applied. Four magnets 3 are provided at four corners of casing 2 of an approximately rectangular parallelepiped shape. The upper surface and the lower surface of casing 2 have apertures that allow the optical axis of lens 4 to pass through, respectively. Lens holding member 5 that holds lens 4 is provided in casing 2. Lens holding member 5 is supported so as to be movable in optical axis direction LA (z-direction) by a pair of elastic members 8, 9 that are attached to casing 2 on both sides of lens 4 with respect to optical axis direction LA of lens 4. Magnetic sensors 6 are fixed to lens 4. Accordingly, lens 4 and magnetic sensors 6 are supported so as to be movable relative to magnets 3 in optical axis direction LA. Two magnetic sensors 6 are provided on lens 4, but the number of magnetic sensors 6 is not limited. Light that is collected by lens 4 is converted into image data by means of an imaging device (not shown), such as a CMOS device.

Annular or polygonal coil 7 is supported by lens holding member 5 inward of magnets 3 such that coil 7 is opposite to magnets 3. Elastic member 9 on the lower side of the figure is composed of two electrically conductive members 9a, 9b, which are connected to respective ends of coil 7 via lens holding member 5. When a current is caused to flow in coil 7 through two electrically conductive members 9a, 9b, coil 7 receives force in optical axis direction LA due to interaction (the Lorentz force) between a magnetic field that is generated by magnets 3 and the current that flows in coil 7. Coil 7 moves in optical axis direction LA against the biasing force of elastic members 8, 9. Lens holding member 5, lens 4 and magnetic sensors 6 also move in optical axis direction LA relative to magnets 3. Since an external magnetic field that is generated by magnets 3 is applied to magnetic sensors 6, when lens 4 moves upward in the z-direction, the distance between magnetic sensors 6 and magnets 3 in the z-direction is shortened and a larger magnetic field intensity is detected. When lens 4 moves downward in the z-direction, the distance between magnetic sensors 6 and magnets 3 in the z-direction is increased and magnetic field intensity that is detected is reduced. FIG. 1 shows magnetic flux B of the external magnetic field. Based on the principle above, magnetic sensors 6 detect and output a change of the external magnetic field that is caused by movement of lens 4. Since magnet 3 generates external magnetic field that is detected by magnetic sensor 6 in this manner, magnet 3 is referred to as external magnet 3 in the following description.

It should be noted that the above-mentioned embodiment is exemplary, and various configurations are possible as long as magnetic sensor 6 is movable relative to magnet 3. For example, a piezoelectric device, a shape memory alloy or a polymer actuator may be used instead of the coil as means of driving lens 4 to which magnetic sensors 6 are fixed. It is also possible that magnetic sensors 6 are fixed to casing 2 and that magnets 3 are movable relative to casing 2 together with lens 4. In other words, camera module 1 may have a first member that includes lens 4; a second member that supports the first member such that the first member is relatively movable in optical axis direction LA of lens 4; magnetic sensor 6; and external magnet 3. Magnetic sensor 6 may be supported by the first member or the second member, and external magnet 3 may be supported by the other first member or the other second member. The change of the distance between magnetic sensor 6 and external magnet 3 is linked with the change of the distance between lens 4 and the imaging device, and as mentioned later, the distance between lens 4 and the imaging device can be detected from the output of magnetic sensor 6.

Figure 2:
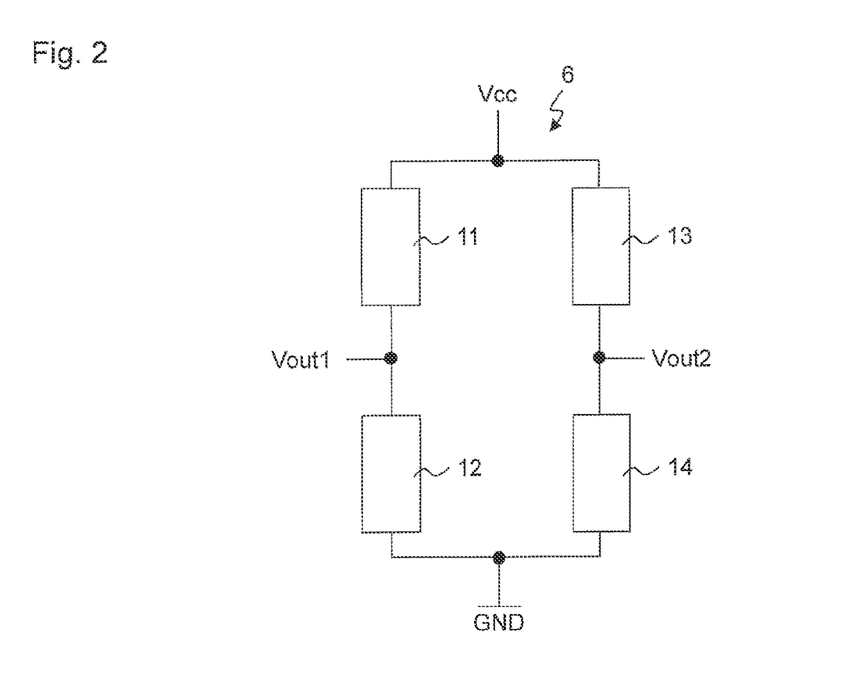
FIG. 2 is a circuit diagram showing a schematic configuration of the magnetic sensor.

FIG. 2 shows a schematic configuration of magnetic sensor 6. Magnetic sensor 6 has four element arrays 11 to 14. Element arrays 11 to 14 are connected to each other in a bridge circuit (a Wheatstone bridge). Four element arrays 11 to 14 are separated into two sets. Element arrays 11, 12 and element arrays 13, 14 of the sets are connected in series, respectively. One end of each set of the element arrays is connected to power supply voltage Vcc, and the other end thereof is grounded (GND). Magnetic sensor 6 outputs the intensity of an external magnetic field by detecting the difference between middle point voltages Vout1 and Vout2 of the respective sets of the element arrays. It should be noted that the external magnetic field can also be detected by using middle point voltage Vout1 or Vout 2 alone.

Figure 3A:
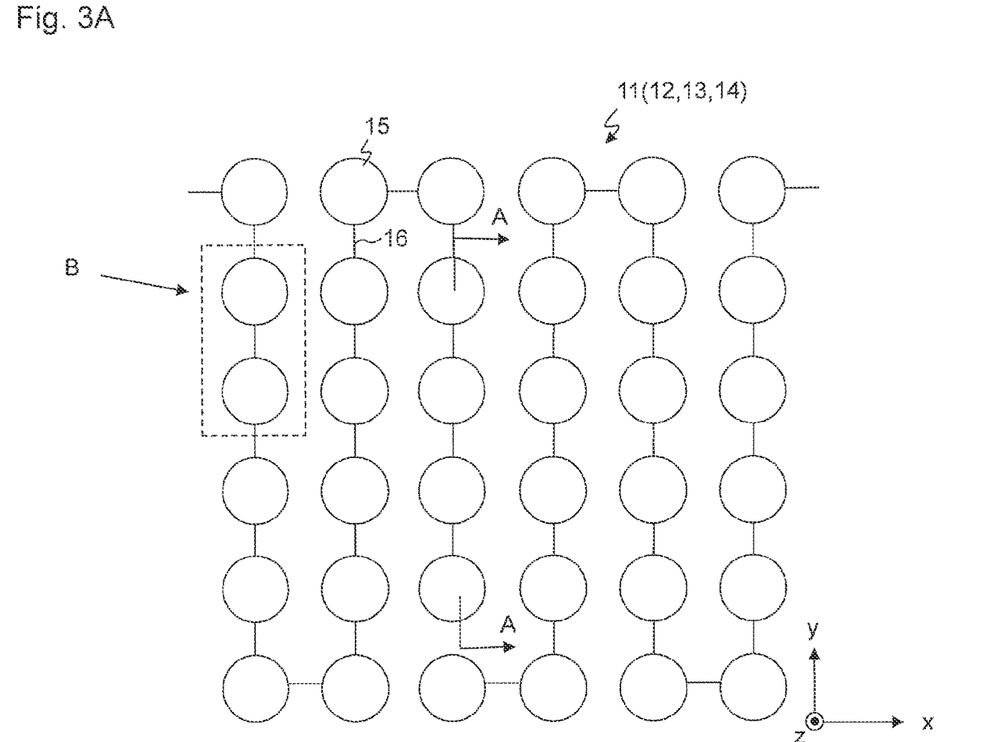
FIGS. 3A and 3B are a plan view and a cross-sectional view showing a schematic configuration of the magnetic sensor, respectively.
Figure 3B:
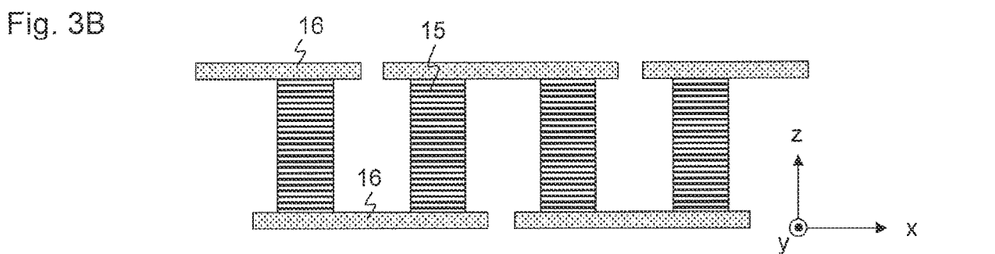
Figure 4:
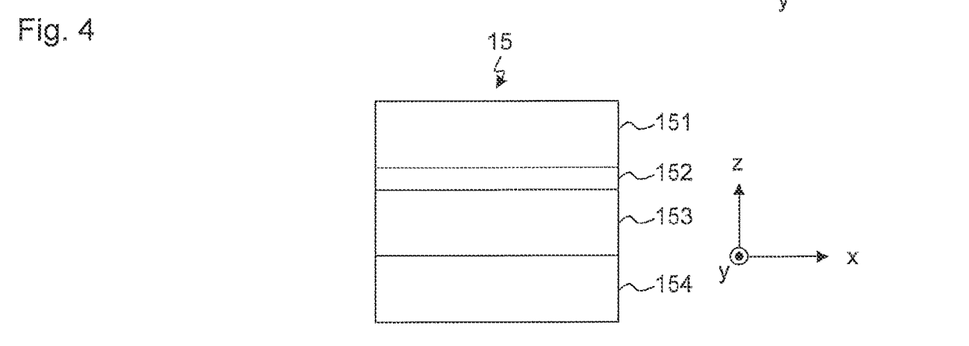
FIG. 4 is a cross-sectional view showing a film configuration of a magneto-resistive effect element.

FIG. 3A shows a schematic plan view of a magnetic sensor. FIG. 3B shows a schematic cross-sectional view of the magnetic sensor taken along line A-A in FIG. 3A. FIG. 4 shows a film configuration of a magneto-resistive effect element. Each of element arrays 11 to 14 includes a plurality of magneto-resistive effect elements 15 that are connected in series and lead wires 16 that connect magneto-resistive effect elements 15. Magneto-resistive effect elements 15 generate a magnetic resistance change in accordance with a change of an external magnetic field. The number of magneto-resistive effect elements 15 in each element array 11 to 14 is not limited, but, for example, tens of magneto-resistive effect elements 15 may be connected in series. By increasing the number of magneto-resistive effect elements 15, variation of middle point voltages Vout1 and Vout2 can be limited, and the external magnetic field can be measured more accurately. As mentioned later, each magneto-resistive effect element 15 is a TMR (Tunneling Magneto-Resistive) element, and lead wires 16 that apply a sense current to magneto-resistive effect element 15 are connected both to the upper end and to the lower end of each magneto-resistive effect element 15. Each lead wire 16 connects the upper ends or the lower ends of magneto-resistive effect elements 15 that are adjacent to each other. Magneto-resistive effect element 15 is formed in a cylindrical shape having an approximately circular cross section, but it may also be formed in a pillar shape having a rectangular or an oval cross section.

Magneto-resistive effect element 15 has a film configuration of a typical spin valve. Specifically, magneto-resistive effect element 15 has: free layer 151 whose magnetization direction changes in accordance with an external magnetic field; pinned layer 153 whose magnetization direction is fixed with respect to the external magnetic field: spacer layer 152 that is positioned between free layer 151 and pinned layer 153 and that is in contact both with free layer 151 and with pinned layer 153; and antiferromagnetic layer 154 that is in contact with pinned layer 153 on the back side thereof, as seen from spacer layer 152. Free layer 151, spacer layer 152, pinned layer 153 and antiferromagnetic layer 154 are stacked above a substrate, not shown. Antiferromagnetic layer 154 fixes the magnetization direction of pinned layer 153 by exchange coupling with pinned layer 153. Pinned layer 153 may also have a synthetic configuration having two ferromagnetic layers and a nonmagnetic intermediate layer that is interposed therebetween. Spacer layer 152 is a nonmagnetic and electrically conductive layer that is made of a nonmagnetic metal, such as Cu, or a tunnel barrier layer that is made of a nonmagnetic insulating material, such as $Al_2O_3$. When spacer layer 152 is a nonmagnetic and electrically conductive layer, magneto-resistive effect element 15 functions as a giant magneto-resistive (GMR) element, and when spacer layer 152 is a tunnel barrier layer, magneto-resistive effect element 15 functions as a TMR element. Because of a large MR change rate and a resultant large output voltage of the bridge circuit, magneto-resistive effect element 15 is more preferably configured by a TMR element.

Figure 5A:
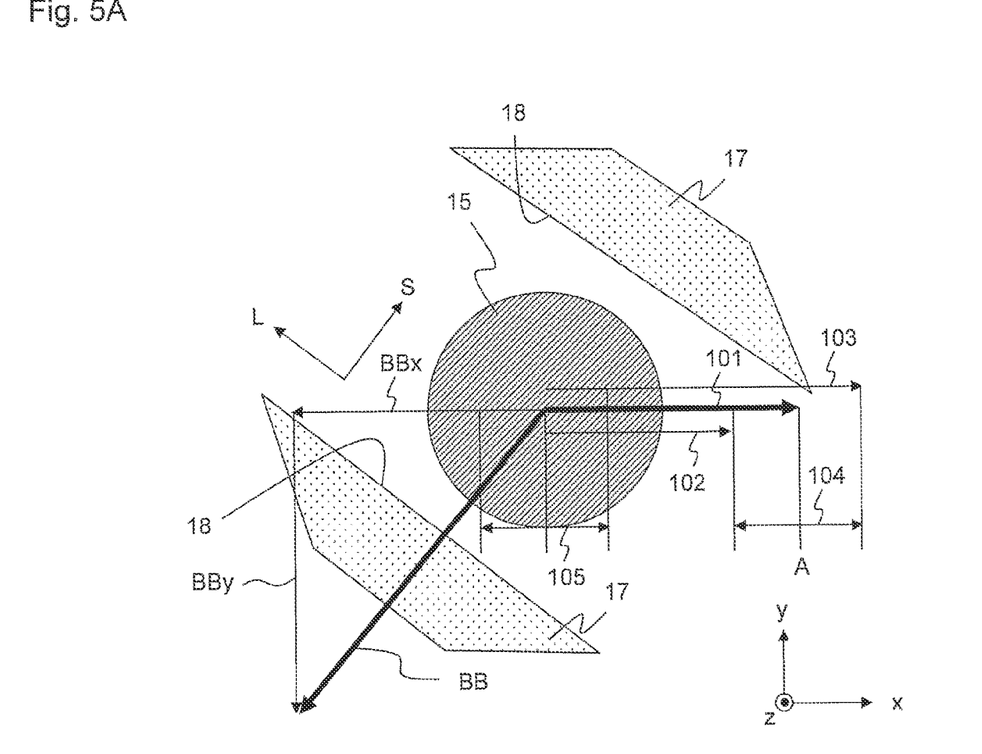
FIGS. 5A and 5B are diagrams showing an application pattern of a bias magnetic field and a magnetic field intensity-output curve, respectively.

FIG. 5A shows an xy-plane cross-sectional view of magneto-resistive effect element 15 and a pair of bias magnets 17 that are provided on the lateral sides of magneto-resistive effect element 15. A pair of bias magnets 17, which are made of a hard magnetic material, such as CoPt, is provided near and on both sides of each magneto-resistive effect element 15. Bias magnet 17 has a cross section that is elongated in longitudinal direction L, and in this cross section, bias magnet 17 is magnetized in direction S that is perpendicular to longitudinal direction L. In other words, bias magnet 17 has a shape that is elongated in a direction that is perpendicular to the magnetization direction, and bias magnetic field BB is applied in direction S. The positions of bias magnets 17 in the z-direction are not limited, but bias magnets 17 are desirably provided at least on both lateral sides of free layer 151 in the z-direction. Bias magnets 17 apply bias magnetic field BB to free layer 151 of magneto-resistive effect element 15. Arrow 101 indicates an external magnetic field from external magnet 3. As mentioned above, when external magnets 3 that are fixed to moving lens 4 move in the z-direction, the intensity of the external magnetic field changes around the median value. In other words, the magnitude of the external magnetic field changes between arrow 102 and arrow 103 with arrow 101 as the center.

Figure 5B:
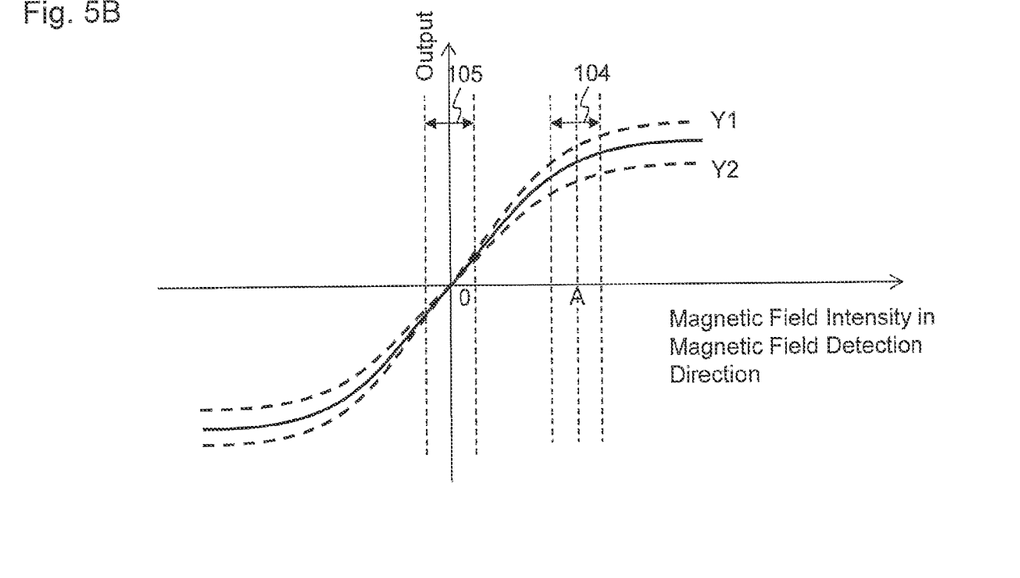

FIG. 5B shows the relationship between a magnetic field intensity and an output of a magnetic sensor. In general, magneto-resistive element 15 is characterized in that the output is saturated when the magnetic field intensity reaches a certain value. Magnetic sensor 6 is always subjected to an external magnetic field that is generated by external magnets 3. When bias magnets 17 are not provided, substantially only the external magnetic field that is generated by external magnets 3 is applied to magnetic sensor 6. In this case, the output of magnetic sensor 6 changes within a range that corresponds to variation range 104 around median value A of the external magnetic field intensity. However, operating magnetic sensor 6 within variation range 104 of the external magnetic field intensity is disadvantageous for the following reasons.

The external magnetic field is calculated from the output of magnetic sensor 6. In other words, the external magnetic field intensity is reversely calculated from the output of magnetic sensor 6 in the magnetic field intensity-output curve shown in FIG. 5B. Accordingly, when magnetic sensor 6 is used around point A, it is difficult to enhance the accuracy with which the external magnetic field intensity is detected because only a small change of the output can be obtained in response to the change of the magnetic field intensity. Next, the linearity of the output is not good around point A. The external magnetic field intensity is calculated by approximating the magnetic field intensity-output curve shown in FIG. 5B by many linear functions that are connected to each other and by applying the output to the linear functions. When magnetic sensor 6 is used around point A, the magnetic field intensity-output curve needs to be approximated by many linear lines, which require a complex algorithm for calculating the external magnetic field intensity and a large file size in a memory in order to store the data of the many linear lines. Furthermore, when magnetic sensor 6 is used around point A, offset temperature characteristics deteriorate. The offset temperature characteristics indicate how the gradient of the magnetic field intensity-output curve changes depending on temperatures. Specifically, the magnetic field intensity-output curve of magneto-resistive effect element 15 changes depending on temperatures as broken lines Y1 and Y2. Since the absolute value of the detected external magnetic field intensity is large when magnetic sensor 6 is used around point A, the influence of the offset temperature characteristics tends to be increased.

In the present embodiment, bias magnets 17 are provided such that the surface of each bias magnet 17 that is opposite to magneto-resistive effect element 15 (hereinafter, referred to as element facing surface 18) is inclined relative to the y-direction that is perpendicular to the x-direction in which the external magnetic field is applied. Thus, bias magnets 17 apply bias magnetic field BB having component BBx in a direction such that component BBx cancels the external magnetic field that is applied to magneto-resistive effect element 15. Ideally, x-component BBx of bias magnetic field BB is approximately equal to median value A of the external magnetic field and has a sign that is the reverse of median value A of the external magnetic field. Therefore, the combined magnetic field, or the summation of median value A of the external magnetic field and bias magnetic field BB, becomes substantially zero. Since magnetic sensor 6 changes within magnetic field intensity range 105 around the zero magnetic field, the above-mentioned problems hardly occurs. In other words, the external magnetic field is detected more accurately, the algorithm for calculating the external magnetic field intensity is simplified, memory consumption is limited, and the influence of the offset temperature characteristics is reduced. It should be noted that, in the ideal state where the external magnetic field and x-component BBx of bias magnetic field BB are balanced, only y-component BBy of bias magnetic field BB is applied to free layer 151. Since the magnetization of pinned layer 153 is fixed in the x-direction, the magnetization direction of free layer 151 is perpendicular to the magnetization direction of pinned layer 153 in this state.

Figure 6:
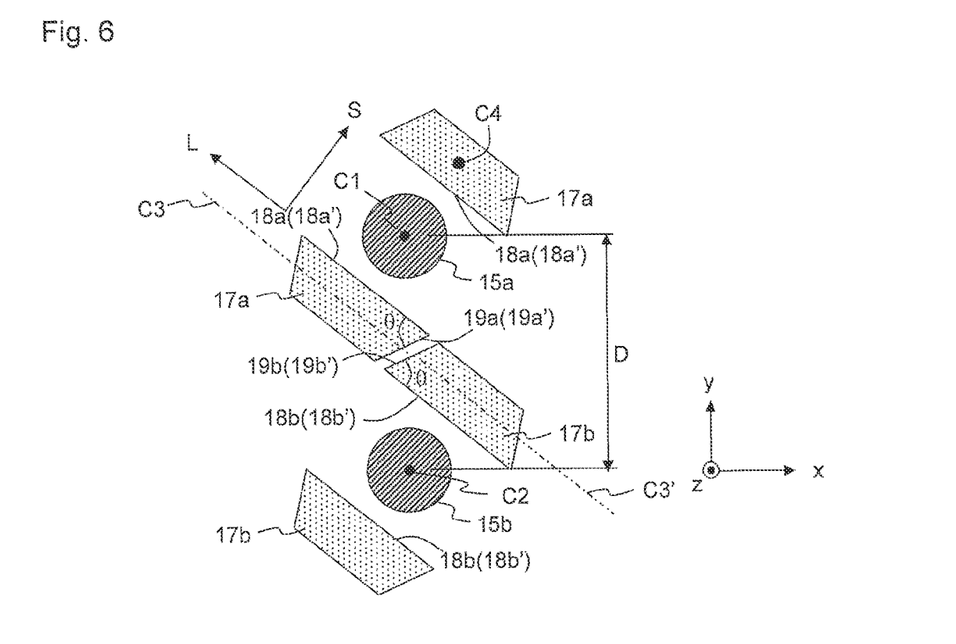
FIG. 6 is a schematic plan view of the bias magnet shown in FIG. 5A.
Figure 7:
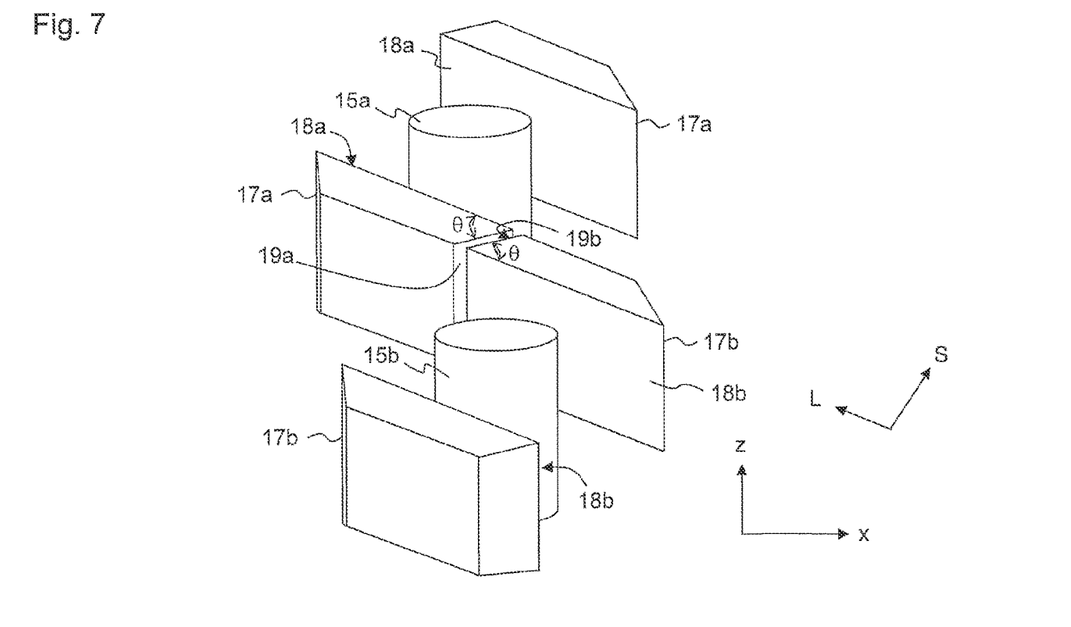
FIG. 7 is a schematic perspective view of the bias magnet shown in FIG. 5A.

FIG. 6 is an enlarged view of portion B in FIG. 3A, showing a plan view of magneto-resistive effect elements 15 and bias magnets 17 in the xy-plane. FIG. 7 shows a perspective view of portion B. In the present embodiment, a plurality of sets of a magneto-resistive effect element and a pair of bias magnets are provided. In the following description, one of the magneto-resistive effect elements that are adjacent to each other is referred to as first magneto-resistive effect element 15a, and the other is referred to as second magneto-resistive effect element 15b. Moreover, a pair of bias magnets that are provided on both sides of first magneto-resistive effect element 15a is referred to as first bias magnets 17a, and a pair of bias magnets that are provided on both sides of second magneto-resistive effect element 15b is referred to as second bias magnets 17b. Two first bias magnets 17a of the pair have the same shapes and are in rotational symmetry with respect to z-directional center line C1 that passes through first magneto-resistive effect element 15a. Similarly, two second bias magnets 17b of the pair have the same shapes and are in rotational symmetry with respect to z-directional center line C2 that passes through second magneto-resistive effect element 15b. First magneto-resistive effect element 15a and second magneto-resistive effect element 15b have the same configurations, and first bias magnets 17a and second bias magnets 17b also have the same configurations. The positional relationship between first magneto-resistive effect element 15a and first bias magnets 17a is the same as the positional relationship between second magneto-resistive effect element 15b and second bias magnets 17b.

First bias magnets 17a have first element facing surfaces 18a that are opposite to first magneto-resistive effect element 15a and that extend in longitudinal direction L. Second bias magnets 17b have second element facing surfaces 18b that are opposite to second magneto-resistive effect element 15b and that extend in longitudinal direction L. First element facing surfaces 18a and second element facing surfaces 18b are parallel to each other. First bias magnet 17a has first lateral surface 19a that is connected to first element facing surface 18a at acute angle θ, and second bias magnet 17b has second lateral surface 19b that is connected to second element facing surface 18b at acute angle θ. In the xy-cross section shown in FIG. 6, first element facing surface 18a, second element facing surface 18b, first lateral surface 19a and second lateral surface 19b may also be referred to as first element facing side 18a', second element facing side 18b', first lateral side 19a' and second lateral side 19b', respectively. It should be noted that, FIG. 6 may also be regarded as a projection plane which is parallel to the xy-plane and onto which first and second bias magnets 17a, 17b and first and second magneto-resistive effect elements 15a, 15b are projected.

The areas of cross sections of first and second bias magnets 17a, 17b that are parallel to first and second element facing surfaces 18a, 18b gradually increase as the cross sections approach first and second magneto-resistive effect elements 15a, 15b, respectively. In other words, in the xy-cross section shown in FIG. 6, first element facing side 18a' is longer than the other sides of first bias magnet 17a, and second element facing side 18b' is longer than the other sides of second bias magnet 17b. In the present embodiment, first and second bias magnets 17a, 17b in the xy-cross section have trapezoid cross-sections in which first and second element facing sides 18a', 18b' are long sides of the trapezoids, respectively.

Conventionally, there is known a bias magnet that has a rectangular cross section in which a long side of the rectangle faces an element and that is magnetized in the short side direction. Such a bias magnet has high space efficiency that allows many magneto-resistive effect elements to be arranged in a small space, but the magnetization direction tends to be directed in the longitudinal axis direction due to shape anisotropy that is caused by the elongate shape. When the magnetization direction is directed in the longitudinal axis direction, the x-directional component of bias magnetic field BB is changed, and the external magnetic field cannot be effectively cancelled. As a result, the center of the magnetic field intensity shifts to the positive or the negative side in the magnetic field intensity-output curve, making it difficult to solve the above-mentioned problems. Since the shape anisotropy is mitigated due to the trapezoidal cross-sections of bias magnets 17a, 17b in the present embodiment, magnetization direction S is less likely to be directed in longitudinal direction L that is perpendicular to magnetization direction S. As a result, the x-directional component of bias magnetic field BB is more accurately applied in the direction such that the component cancels the external magnetic field, and above-mentioned problems can be easily solved.

Figure 8A:
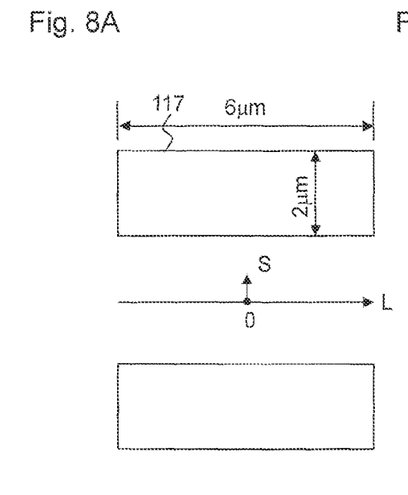
FIGS. 8A to 8D are diagrams showing bias magnets of comparative examples and an embodiment, as well as distribution of a bias magnetic field.
Figure 8B:
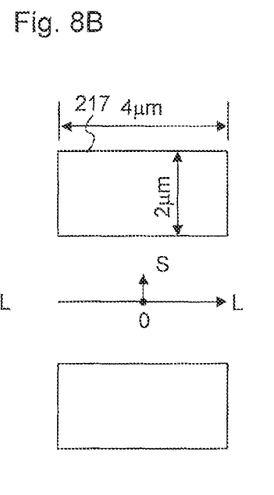
Figure 8C:
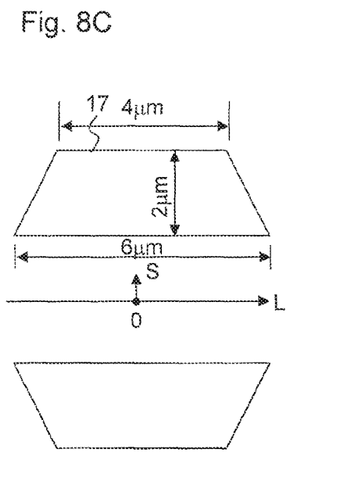
Figure 8D:
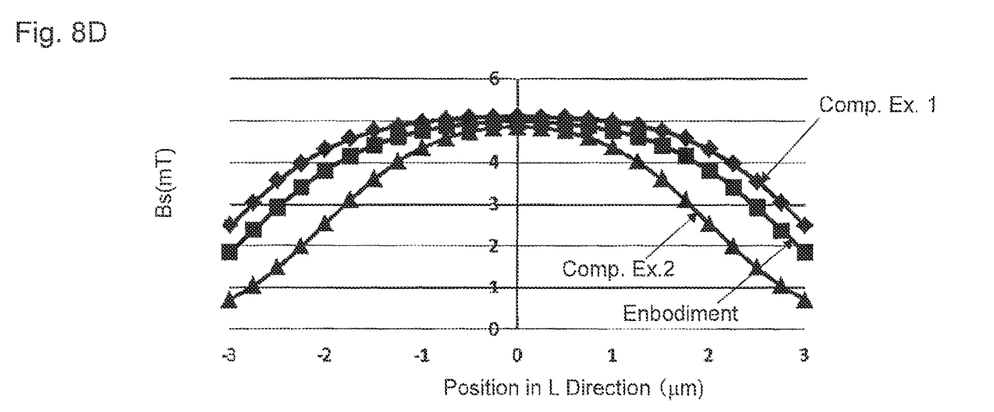

Element facing sides 18a', 18b' are longer than the width of first and second magneto-resistive effect elements 15a, 15b in longitudinal direction L, respectively. Thus, bias magnetic field BB is distributed uniformly in longitudinal direction L. FIG. 8A shows a plan view of bias magnet 117 of Comparative Example 1, FIG. 8B shows a plan view of bias magnet 217 of Comparative Example 2, and FIG. 8C shows a plan view of bias magnet 17 of an embodiment. FIG. 8D shows distributions of bias magnetic field BB of bias magnet 17, 117 and 217 in longitudinal direction L. Bias magnet 17 of the embodiment is the same as bias magnet 17 described using FIGS. 6 and 7. Bias magnet 117 of Comparative Example 1 has a rectangular cross section, and the length of the long side is the same as the length of the long side of bias magnet 17 of the embodiment. Bias magnet 217 of Comparative Example 2 has a rectangular cross section, and the length of the long side is the same as the length of the short side of bias magnet 17 of the embodiment. The widths of first and second magneto-resistive effect elements 15a, 15b in longitudinal direction L are approximately the same as the length of the long side of bias magnet 217 of Comparative Example 2. As shown in FIG. 8D, Comparative Example 1 shows a strong bias magnetic field that is uniformly distributed in direction L, while Comparative Example 2 shows a bias magnetic field that is distributed, uniformly but in the smallest range, in direction L. The embodiment shows a bias magnetic field distribution approximately the same as that of Comparative Example 1. Accordingly, element facing sides 18a', 18b' are preferably 1.5 or more times longer than the widths of first and second magneto-resistive effect elements 15a, 15b in longitudinal direction L.

Furthermore, as shown in FIGS. 6 and 7 of the present embodiment, first and second bias magnets 17a, 17b are combined with first and second magneto-resistive effect elements 15a, 15b, respectively; first and second magneto-resistive effect elements 15a, 15b are adjacent to each other; and either one of bias magnets 17a and either one of bias magnets 17b are adjacent to each other. Moreover, first lateral surface 19a of first bias magnet 17a and second lateral surface 19b of second bias magnet 17b (first lateral side 19a' and second lateral side 19b' in the xy-cross section shown in FIG. 6) are opposite to each other. First lateral surface 19a and second lateral surface 19b (first lateral side 19a' and second lateral side 19b') are parallel to each other. Thus, first bias magnet 17a and second bias magnet 17b can be more efficiently arranged, and larger numbers of magneto-resistive effect elements 15 can be provided in a limited space. Axis C3 of first bias magnet 17a and axis C3' of second bias magnet 17b may be on the same straight line, or may be displaced from each other. Axis C3 passes through the center of first bias magnet 17a with regard to the short side direction thereof and extends parallel to longitudinal direction L (the long side), and axis C3' passes through the center of second bias magnet 17b with regard to the short side direction thereof and extends parallel to longitudinal direction L (the long side).

Figure 9A:
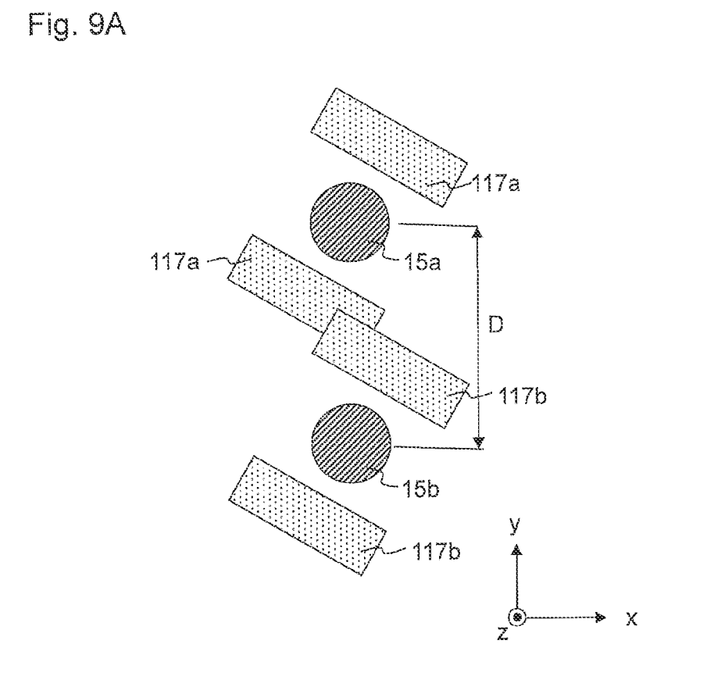
FIGS. 9A and 9B are schematic plan views of the bias magnets of the comparative examples.
Figure 9B:
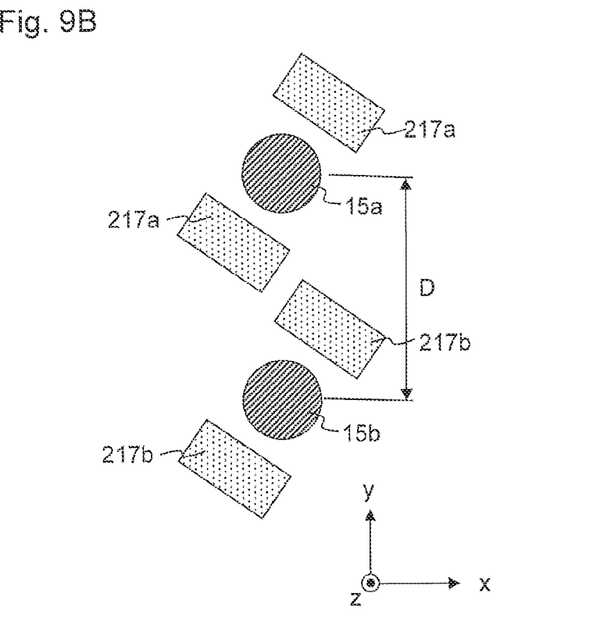

FIG. 9A shows an exemplary arrangement of bias magnets 117a, 117b of Comparative Example 1, and FIG. 9B shows an exemplary arrangement of bias magnets 217a, 217b of Comparative Example 2. In these figures, distance D between adjacent magneto-resistive effect elements 15a, 15b in the y-direction is the same as that in the embodiment shown in FIG. 6. In Comparative Example 1 shown in FIG. 9A, first bias magnet 117a and second bias magnet 117b physically interfere with each other. This means that distance D between adjacent magneto-resistive effect elements 15a, 15b in the y-direction needs to be increased as compared to FIG. 6, in other words, and that the number of magneto-resistive effect elements 15 that can be included in each of element arrays 11 to 14 needs to be decreased. In Comparative Example 2 shown in FIG. 9B, although there is no occurrence of interference between first bias magnet 217a and second bias magnet 217b, the range of the bias magnetic field that is uniformly applied is narrow, as described with reference to FIGS. 8A to 8D. In other words, it is possible, in the embodiment, to ensure that large bias magnetic field BB is applied uniformly over a wide range in longitudinal direction L and that bias magnets 17 are efficiently arranged.

Figure 10A:
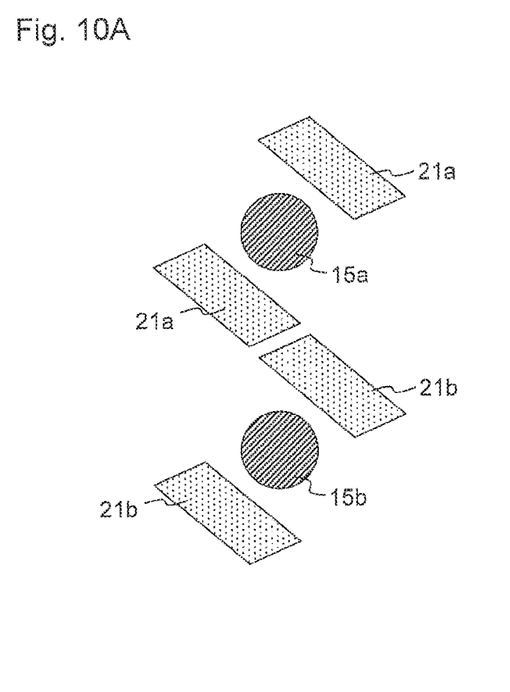
FIGS. 10A to 10D are schematic plan views showing various modifications of the shape of the bias magnet.
Figure 10B:
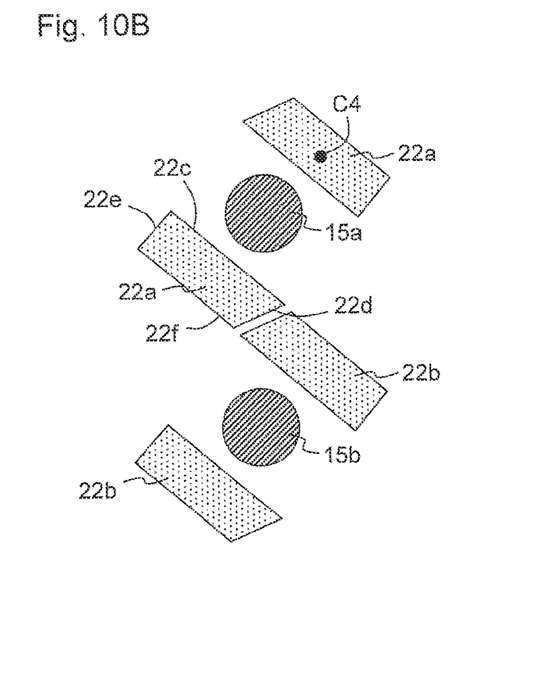
Figure 10C:
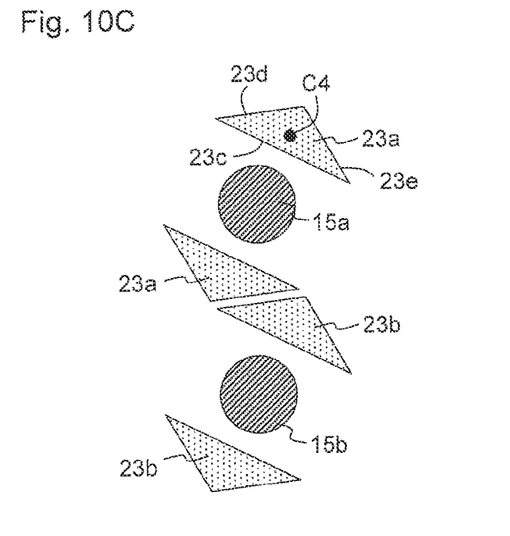
Figure 10D:
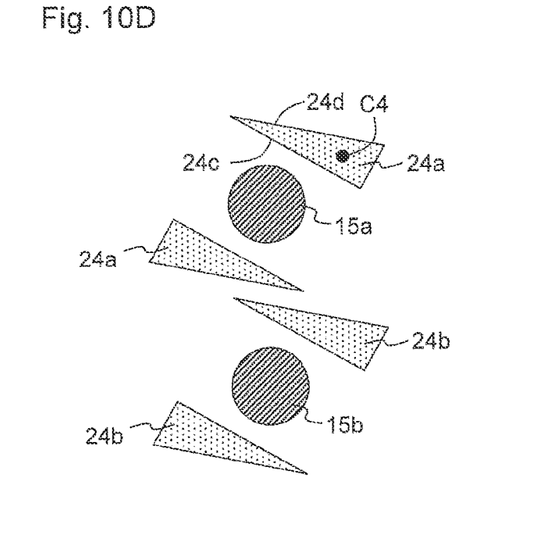

FIGS. 10A to 10D show various modifications of the bias magnets. In any of the modifications, all the bias magnets have the same shapes. Referring to FIG. 10A, both first and second bias magnets 21a, 21b have parallelogramatic cross sections. Referring to FIG. 10B, both first and second bias magnets 22a, 22b have quadrangular cross sections. Side 22d that is opposite to the other bias magnet 22a or 22b is not perpendicular to element facing side 22c, while side 22e that is opposite to side 22d is perpendicular to element facing side 22c. Side 22f that is opposite to element facing side 22c is parallel to element facing side 22c. Referring to FIG. 10C, both first and second bias magnets 23a, 23b are isosceles triangles. Element facing side 23c is the base of the isosceles triangle and is longer than the other two sides 23d, 23e. Referring to FIG. 10D, both first and second bias magnets 24a and 24b are right triangles. Element facing side 24c is the base of the right triangle and is shorter than hypotenuse 24d. The modified bias magnets shown in FIGS. 10B to 10D and the above-mentioned bias magnets having a trapezoidal cross section are in rotational asymmetry with respect to center line (second center line) C4 that is parallel to the z-directional center line (first center lines) of magneto-resistive effect element 15a, 15b and that passes through the center of gravity of the bias magnet. Rotational asymmetry is defined to be a shape whose cross section does not coincide with the original cross section when it is rotated at any angle other than 360×N degrees (N is a natural number) around the center line that passes through the center of gravity of the shape.

FIGS. 11A to 13B shows xy-plane plan views of magnetic sensors 6 having bias magnets that are arranged near GMR elements, in which a sense current flows in the y-direction that is perpendicular to the stacking direction (z-direction). AMR elements may be used in place of the GMR elements. The magneto-resistive effect element of the present embodiment has longitudinal axis C5 that extends in the direction that is perpendicular to the external magnetic field applied to the magneto-resistive effect element, and a plurality of bias magnets are arranged on the magneto-resistive effect element along longitudinal axis C5. Magneto-resistive elements are connected in series by means of lead wires, not shown. It should be noted that, FIGS. 11A to 13B can also be regarded as projection planes which are parallel to the xy-plane and onto which the bias magnets and the magneto-resistive effect elements are projected.

Figure 11A:
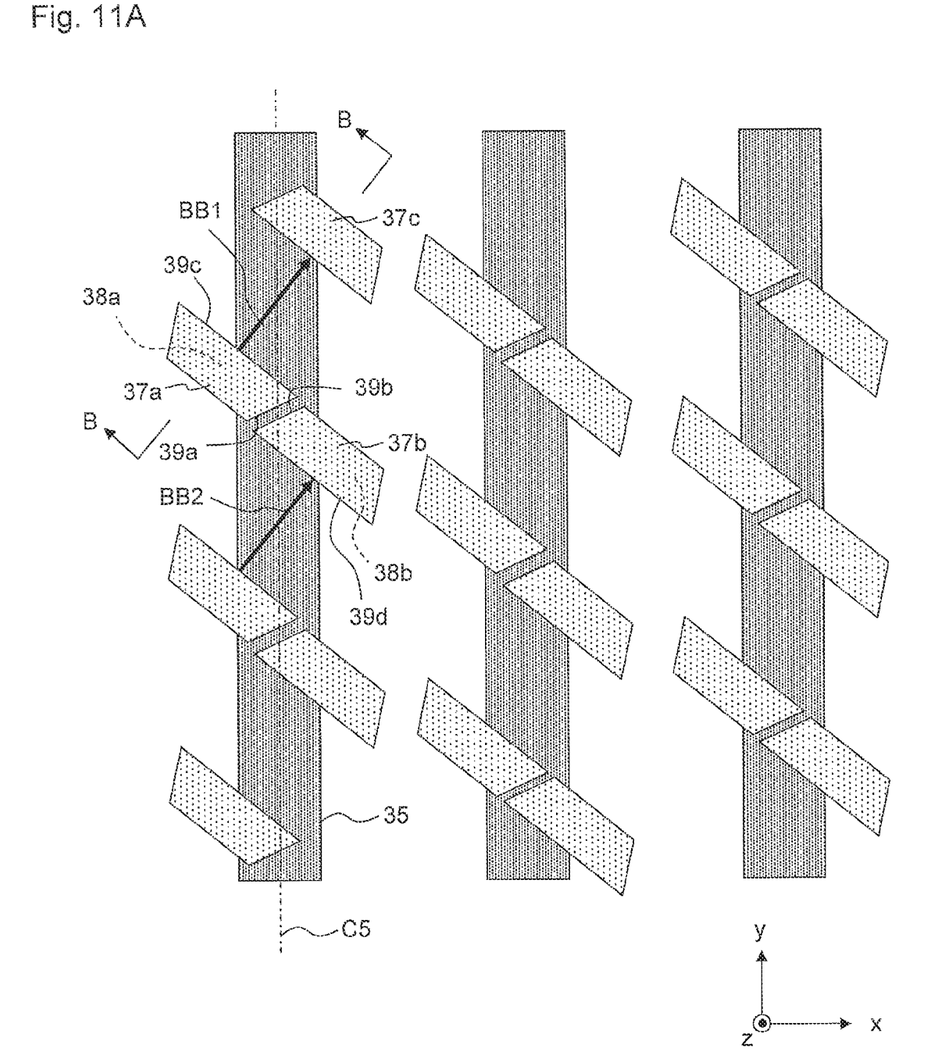
FIGS. 11A and 11B are a schematic plan view and a sectional view of a magnetic sensor according to another embodiment of the present invention.
Figure 11B:
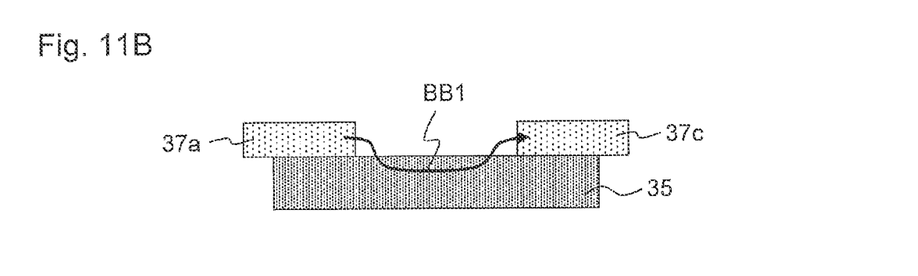

In the examples shown in FIGS. 11A and 11B, the magnetic sensor has first bias magnet 37a that is opposite to the upper surface of magneto-resistive effect element 35, and second bias magnet 37b that is opposite to the upper surface of magneto-resistive effect element 35 and that is adjacent to first bias magnet 37a. First bias magnet 37a applies bias magnetic field BB1 to magneto-resistive effect element 35. Bias magnetic field BB1 has a component in the direction such that the component cancels the external magnetic field that is applied to magneto-resistive effect element 35 and a component that is perpendicular to the external magnetic field. Second bias magnet 37b applies bias magnetic field BB2 to magneto-resistive effect element 35. Magnetic field BB2 has a component in the direction such that the component cancels the external magnetic field that is applied to magneto-resistive effect element 35 and a component that is perpendicular to the external magnetic field. First bias magnet 37a has first element facing surface 38a that is opposite to magneto-resistive effect element 35, first lateral surface 39a that is connected to first element facing surface 38a and third lateral surface 39c that is connected to first element facing surface 38a and that is connected to first lateral surface 39a at an acute angle. Second bias magnet 37b has second element facing surface 38b that is opposite to magneto-resistive effect element 35, second lateral surface 39b that is connected to second element facing surface 38b and fourth lateral surface 39d that is connected to second element facing surface 38b and that is connected to second lateral surface 39b at an acute angle. Bias magnet 37 has a trapezoidal cross-sectional shape, as seen in the z-direction. First lateral surface 39a and second lateral surface 39b are opposite to each other. Preferably, third lateral surface 39c and fourth lateral surface 39d are parallel to each other. First bias magnet 37a and second bias magnet 37b are arranged on a common axis that is parallel to third and fourth lateral surfaces 39c, 39d, but they may be arranged on axes that are different from each other.

Figure 12:
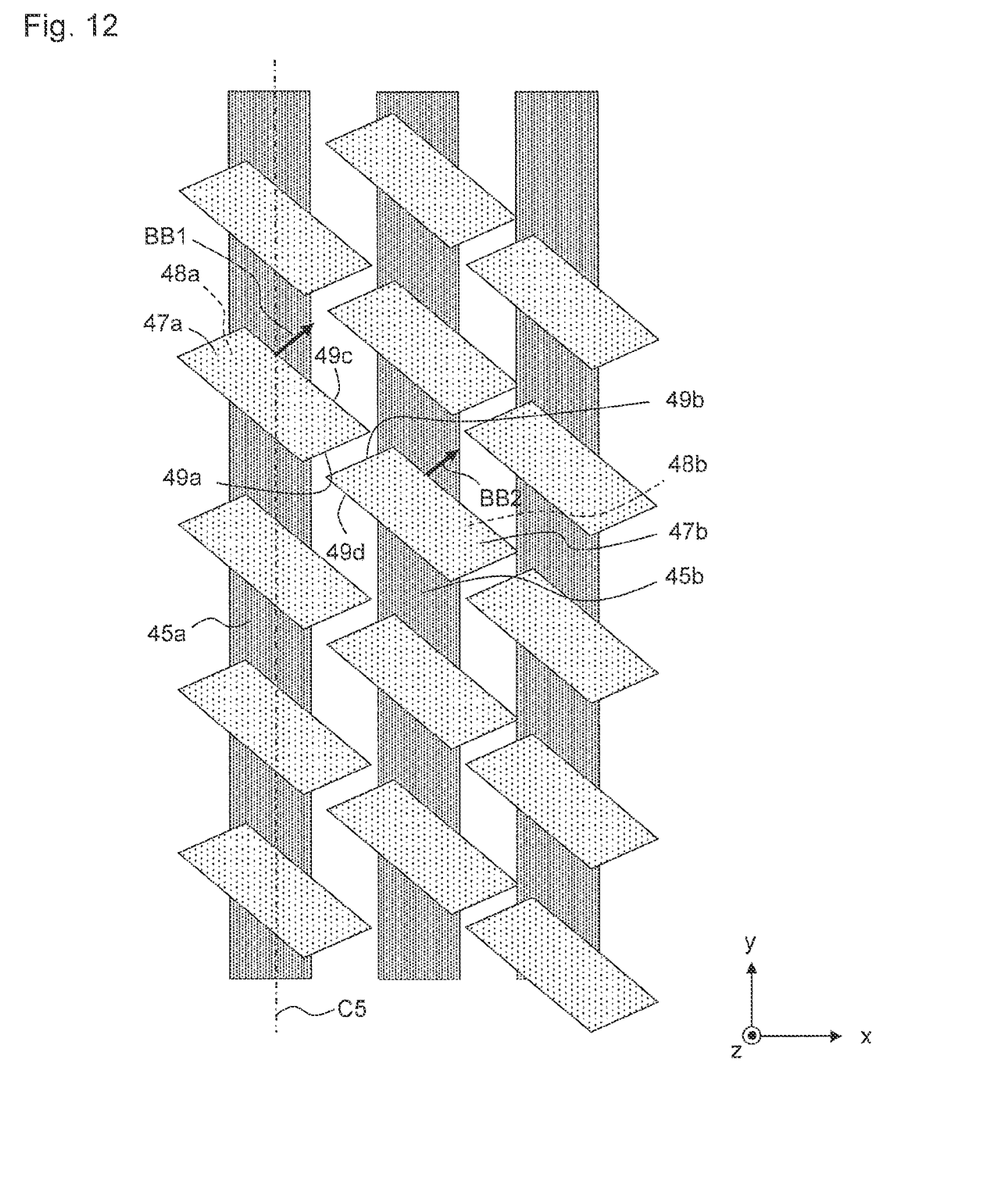
FIG. 12 is a schematic plan view of a magnetic sensor according to another embodiment of the present invention.

In the example shown in FIG. 12, the magnetic sensor has first bias magnet 47a that is opposite to the upper surface of first magneto-resistive effect element 45a and second bias magnet 47b that is opposite to the upper surface of second magneto-resistive effect element 45b and that is adjacent to first bias magnet 47a. First bias magnet 47a applies bias magnetic field BB1 to first magneto-resistive effect element 45a. Bias magnetic field BB1 has a component in the direction such that the component cancels the external magnetic field that is applied to first magneto-resistive effect element 45a and a component that is perpendicular to the external magnetic field. Second bias magnet 47b applies bias magnetic field BB2 to second magneto-resistive effect element 45b. Bias magnetic field BB2 has a component in the direction such that the component cancels the external magnetic field that is applied to second magneto-resistive effect element 45b and a component that is perpendicular to the external magnetic field. First bias magnet 47a has first element facing surface 48a that is opposite to first magneto-resistive effect element 45a, first lateral surface 49a that is connected to first element facing surface 48a and third lateral surface 49c that is connected to first element facing surface 48a and that is connected to first lateral surface 49a at an acute angle. Second bias magnet 47b has second element facing surface 48b that is opposite to second magneto-resistive effect element 45b, second lateral surface 49b that is connected to second element facing surface 48b and fourth lateral surface 49d that is connected to second element facing surface 48b and that is connected to second lateral surface 49b at an acute angle. First and second bias magnets 47a, 47b have parallelogramatic cross-sectional shapes, as seen in the z-direction. First lateral surface 49a and second lateral surface 49b are opposite to each other. Preferably, third lateral surface 49c and fourth lateral surface 49d are parallel to each other. First bias magnet 47a and second bias magnet 47b are arranged on a common axis that is parallel to third and fourth lateral surfaces 49c, 49d, but they may be arranged on axes that are different from each other.

Figure 13A:
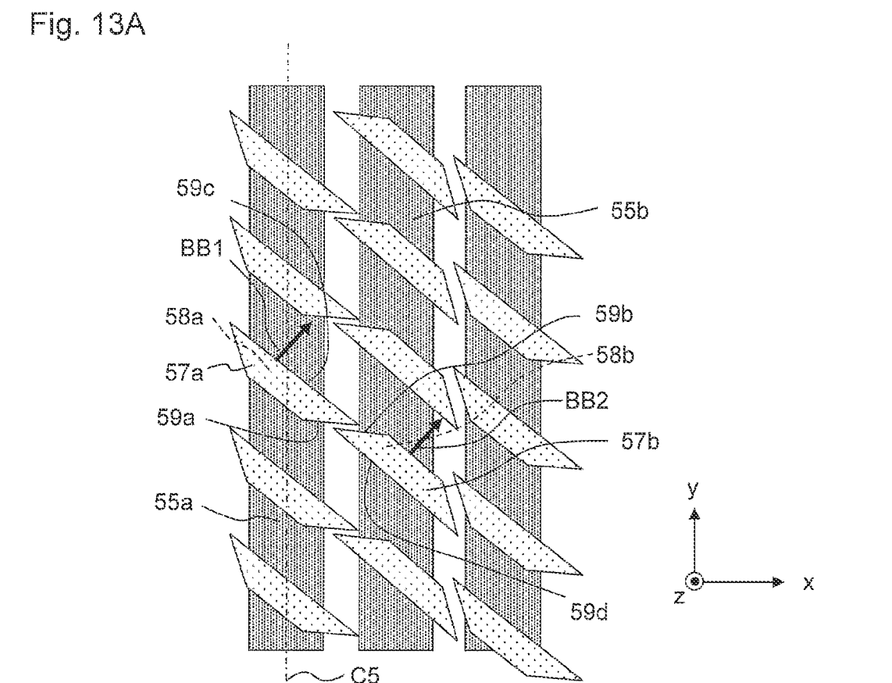
FIGS. 13A and 13B are schematic plan views of a magnetic sensor according to other embodiments of the present invention.
Figure 13B:
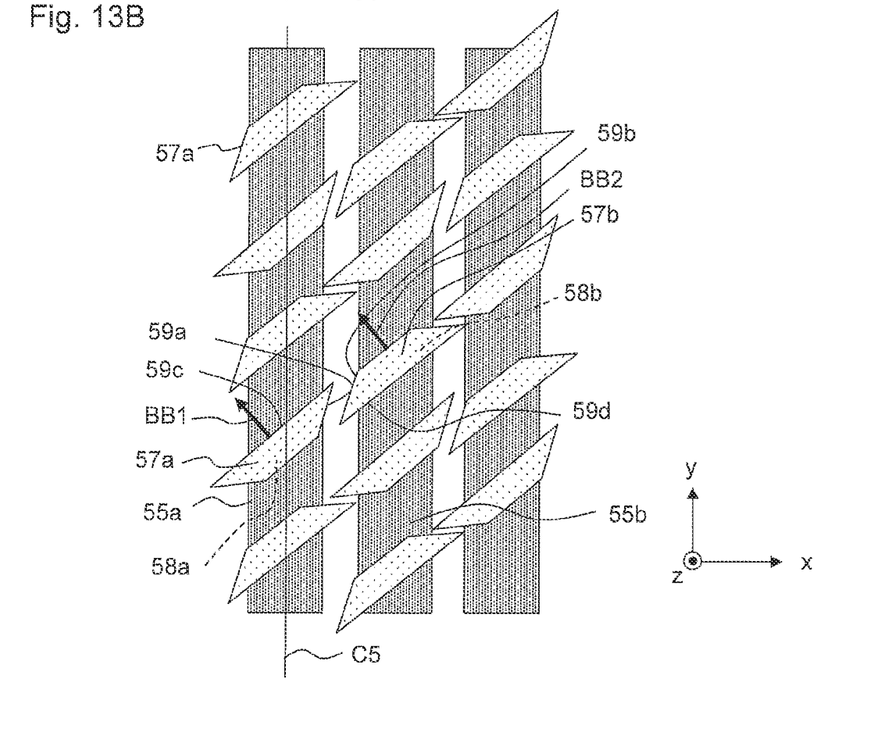

In the examples shown in FIGS. 13A and 13B, the magnetic sensor has first bias magnet 57a that is opposite to the upper surface of first magneto-resistive effect element 55a and second bias magnet 57b that is opposite to the upper surface of second magneto-resistive effect element 55b and that is adjacent to first bias magnet 57a. First bias magnet 57a applies bias magnetic field BB1 to first magneto-resistive effect element 55a. Bias magnetic field BB1 has a component in the direction such that the component cancels the external magnetic field that is applied to first magneto-resistive effect element 55a and a component that is perpendicular to the external magnetic field. Second bias magnet 57b applies bias magnetic field BB2 to second magneto-resistive effect element 55b. Bias magnetic field BB2 has a component in the direction such that the component cancels the external magnetic field that is applied to second magneto-resistive effect element 55b and a component that is perpendicular to the external magnetic field. First bias magnet 57a has first element facing surface 58a that is opposite to first magneto-resistive effect element 55a, first lateral surface 59a that is connected to first element facing surface 58a and third lateral surface 59c that is connected to first element facing surface 58a and that is connected to first lateral surface 59a at an acute angle. Second bias magnet 57b has second element facing surface 58b that is opposite to second magneto-resistive effect element 55b, second lateral surface 59b that is connected to second element facing surface 58b and fourth lateral surface 59d that is connected to second element facing surface 58b and that is connected to second lateral surface 59b at an acute angle. First and second bias magnets 57a, 57b have trapezoidal cross-sectional shapes, as seen in the z-direction. First lateral surface 59a and second lateral surface 59b are opposite to each other. Preferably, third lateral surface 59c and fourth lateral surface 59d are parallel to each other. First bias magnet 57a and second bias magnet 57b are arranged on a common axis that is parallel to third and fourth lateral surfaces 59c, 59d, but they may be arranged on axes that are different from each other.

In the magnetic sensor shown in FIGS. 11A and 11B, the intensity of bias magnetic fields BB1, BB2 is distributed uniformly in a wide range, and bias magnets 37a, 37b are efficiently arranged. In the magnetic sensor shown in FIG. 12, magneto-resistive effect elements 45a, 45b can be arranged with a high density because they can be arranged close to each other in the x-direction. In addition, due to the parallelogramatic shapes of bias magnets 47a, 47b, short circuit between adjacent magneto-resistive effect elements 45a, 45b that is caused by mutual contact can be prevented. In the magnetic sensors shown in FIGS. 13A and 13B, magneto-resistive effect elements 55a, 55b can be arranged with a high density because they can be arranged close to each other in the x-direction in the same manner as the magnetic sensor shown in FIG. 12. In addition, due to the parallelogramatic shapes of bias magnets 57a, 57b, short circuit between adjacent magneto-resistive effect elements 55a, 55b that is caused by mutual contact can be prevented. Furthermore, in the magnetic sensors shown in FIGS. 13A and 13B, efficiency of arrangement can be enhanced by the reduced distance between adjacent magneto-resistive effect elements 55a, 55b. Accordingly, the magnetic field can be more accurately detected by increasing the number of magneto-resistive effect elements 55a, 55b in order to reduce output variation. It should be noted that, in each embodiment in FIGS. 11A to 13B, the bias magnets are opposite to the upper surface of the magneto-resistive effect element with regard to the stacking direction, but they may be opposite to the lower surface of the magneto-resistive effect element with regard to the stacking direction, or they may be opposite both to the upper surface and to the lower surface of the magneto-resistive effect element. The upper surface is a back surface of the magneto-resistive effect element as seen from the substrate, and the lower surface is a surface thereof on the side facing the substrate.

Although certain preferred embodiments of the present invention have been shown and described in detail, it should be understood that various changes and modifications may be made without departing from the spirit or scope of the appended claims.

LIST OF REFERENCE NUMERALS

1 Camera module
2 Casing
3 Magnet
4 Lens

5 Lens holding member
6 Magnetic sensor
7 Coil
8, 9 Elastic member
9a, 9b Electrically conductive members
11 to 14 Element array
15, 35 Magneto-resistive effect element
16 Lead wire
17, 37, 47, 117, 217 Bias magnet
17a, 21a, 22a, 23a, 24a First bias magnet
17b, 21b, 22b, 23b, 24b Second bias magnet
18 Element facing surface
18a First element facing surface
18a' First element facing side
18b Second element facing surface
18b' Second element facing side
19a First lateral surface
19a' First lateral side
19b Second lateral surface
19b' Second lateral side
151 Free layer
152 Spacer layer
153 Pinned layer
154 Antiferromagnetic layer
BB Bias magnetic field
C1, C2 Center line
C3 Common axis
C4 Center line
C5 Longitudinal axis
D Distance in the y-direction between adjacent magneto-resistive effect elements

What is claimed is:

1. A magnetic sensor that moves relative to an external magnet and that detects a change
of an external magnetic field that is generated by the external magnet, the magnetic sensor comprising:
a magneto-resistive effect element that generates a magnetic resistance change in accordance with the change of the external magnetic field; and
a pair of bias magnets that is provided near the magneto-resistive effect element and that applies a bias magnetic field to the magneto-resistive effect element, wherein
each bias magnet has an elongated cross section in a plane that is parallel both to the external magnetic field and to the bias magnetic field,
in a projection plane that is parallel to the elongated cross section and onto which the bias magnets and the magneto-resistive effect element are projected, each bias magnet includes an element facing side that is opposite to the magneto-resistive effect element and that extends in a longitudinal direction, each bias magnet is magnetized in a direction that is perpendicular to the longitudinal direction, and the element facing side is longer than other sides,
each bias magnet has a pair of lateral sides that are both connected to the element facing side at an acute angle, and
each bias magnet has a cross section in a form of an acute trapezoid in which the element facing side is a longer base of the acute trapezoid.

2. The magnetic sensor according to claim 1, further comprising a first set and a second set, each set consisting of the magneto-resistive effect element and the pair of bias magnets, wherein either one of the bias magnets of the first set and either one of the bias magnets of the second set are adjacent to each other, and the lateral side of said either one of the bias magnets of the first set and the lateral side of said either one of the bias magnets of the second set are opposite to each other.

3. The magnetic sensor according to claim 1, wherein the element facing side is 1.5 or more times longer than a width of the magneto-resistive effect element in the longitudinal direction.

4. A magnetic sensor that moves relative to an external magnet and that detects a change of an external magnetic field that is generated by the external magnet, the magnetic sensor comprising:
a magneto-resistive effect element that generates a magnetic resistance change in accordance with the change of the external magnetic field; and
a pair of bias magnets that is provided near the magneto-resistive effect element and that applies a bias magnetic field to the magneto-resistive effect element,
wherein an area of a cross section of each bias magnet gradually increases as the cross section approaches the magneto-resistive effect element, wherein the cross section is parallel to a surface of each bias magnet that is opposite to the magneto-resistive effect element.

5. The magnetic sensor according to claim 4, wherein the pair of bias magnets is in rotational symmetry with respect to a first center line that passes through the magneto-resistive effect element, and each bias magnet is in rotational asymmetry with respect to a second center line that is parallel to the first center line and that passes through a center of gravity of each bias magnet.

6. The magnetic sensor according to claim 1, wherein the magneto-resistive effect element is a TMR element.

7. A magnetic sensor that moves relative to an external magnet and that detects a change of an external magnetic field that is generated by the external magnet, the magnetic sensor comprising:
first and second magneto-resistive effect elements, each generating a magnetic resistance change in accordance with the change of the external magnetic field;
a first bias magnet that is provided near the first magneto-resistive effect element and that applies a bias magnetic field to the first magneto-resistive effect element; and
a second bias magnet that is provided near the second magneto-resistive effect element and that applies a bias magnetic field to the second magneto-resistive effect element, wherein
the first bias magnet includes a first element facing surface that is opposite to the first magneto-resistive effect element and a pair of first lateral sides that are both connected to the first element facing surface at an acute angle,
the second bias magnet includes a second element facing surface that is opposite to the second magneto-resistive effect element and a pair of second lateral sides that are both connected to the second element facing surface at an acute angle, and
one of the first lateral surfaces and one of the second lateral surfaces are opposite to each other.

8. The magnetic sensor according to claim 7, wherein the first element facing surface and the second element facing surface are parallel to each other.

9. The magnetic sensor according to claim 8, wherein the first bias magnet and the second bias magnet are arranged on a common axis that is parallel to the first and second element facing surfaces.

10. A magnetic sensor that moves relative to an external magnet and that detects a change of an external magnetic field that is generated by the external magnet, the magnetic sensor comprising:
- a magneto-resistive effect element that generates a magnetic resistance change in accordance with the change of the external magnetic field; and
- a pair of bias magnets that is provided near the magneto-resistive effect element and that applies a bias magnetic field to the magneto-resistive effect element, wherein
- each bias magnet has an elongated cross section in a plane that is parallel both to the external magnetic field and to the bias magnetic field, and
- in a projection plane that is parallel to the elongated cross section and onto which the bias magnets and the magneto-resistive effect element are projected, each bias magnet includes an element facing side that is opposite to the magneto-resistive effect element and that extends in a longitudinal direction, each bias magnet is magnetized in a direction that is perpendicular to the longitudinal direction, and the element facing side is longer than other sides,
- wherein each bias magnet has lateral sides that are both connected to the element facing side at an acute angle, and the bias magnet has a cross section in which the element facing side is a long side thereof.

11. The magnetic sensor according to claim 2, wherein a positional relationship between the magneto-resistive effect element and the pair of the bias magnets of the first set is the same as a positional relationship between the magneto-resistive effect element and the pair of the bias magnets of the second set.

* * * * *